(12) United States Patent
Swenson et al.

(10) Patent No.: US 6,690,738 B1
(45) Date of Patent: Feb. 10, 2004

(54) TRELLIS CODED MODULATION SYSTEM EMPLOYING A FLEXIBLE TRELLIS CODED MODULATION DECODER

(75) Inventors: Norman L. Swenson, Mountain View, CA (US); Francis J. Smith, Livermore, CA (US); Theodore J. Wolcott, San Jose, CA (US)

(73) Assignee: Lockheed Martin Corp., Bethesda, MD (US)

( * ) Notice: Subject to any disclaimer, the term of this patent is extended or adjusted under 35 U.S.C. 154(b) by 0 days.

(21) Appl. No.: 09/693,227

(22) Filed: Oct. 20, 2000

(51) Int. Cl.[7] .................................................. H04L 5/12

(52) U.S. Cl. ...................... 375/265; 375/262; 714/792; 714/795

(58) Field of Search ................................. 375/265, 262, 375/341; 714/792, 746, 795, 786

(56) References Cited

U.S. PATENT DOCUMENTS

| | | | |
|---|---|---|---|
| 5,363,408 A | * | 11/1994 | Paik et al. .................. 375/261 |
| 6,138,265 A | * | 10/2000 | Morelos-Zaragoza et al. ... 714/792 |

* cited by examiner

*Primary Examiner*—Temesghen Ghebretinsae
(74) *Attorney, Agent, or Firm*—Kenneth W. Float

(57) ABSTRACT

A trellis coded modulation system for use with a plurality of QAM modes that allows a choice of modulation scheme tailored to a communication channel. The system comprises an encoder and a decoder. The decoder uses input and output look-up tables that allow the use of a single decoder/encoder arrangement comprising a Viterbi decoder and a convolutional encoder to map trellis coded modulation to/from multiple modulation constellations. The size of the look-up tables used in the decoder is minimized because recognizable sequences (6 bits) are passed to the Viterbi decoder. The input look-up table provides minimal information about which region the symbol was found. The output look-up table processes the resulting information appropriately.

10 Claims, 5 Drawing Sheets

COSET 00

COSET 01

COSET 10

COSET 11

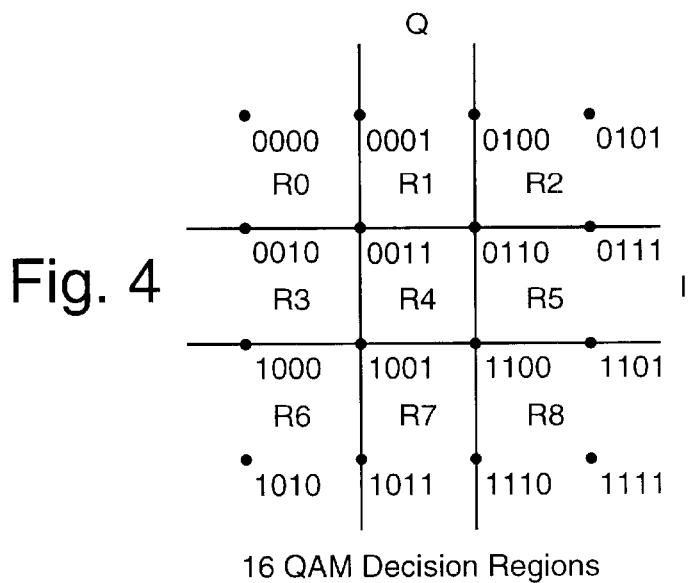
16 QAM Decision Regions
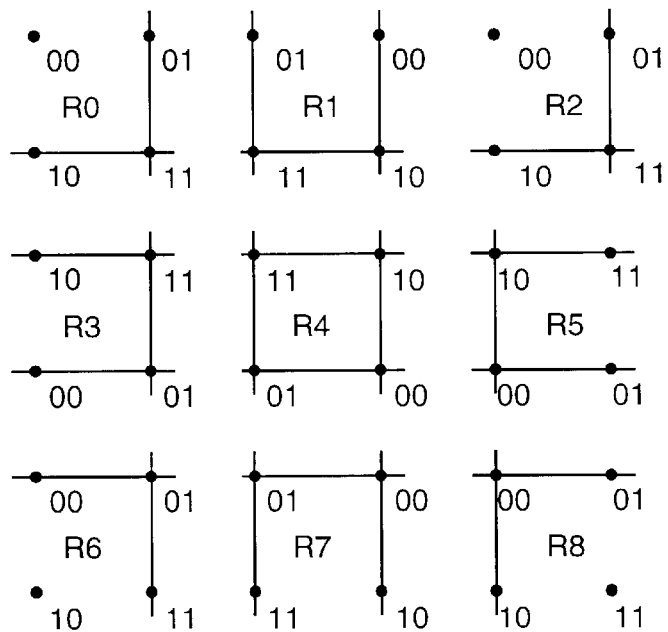
Expanded 16 QAM Decision Regions, 2 LSBs Only

TRELLIS CODED MODULATION SYSTEM EMPLOYING A FLEXIBLE TRELLIS CODED MODULATION DECODER

BACKGROUND

The present invention relates generally to communications systems employing forward error correction (FEC) coding to reduce transmission errors, and more particularly, to an improved and flexible trellis coded modulation (TCM) decoder and system.

U.S. Pat. No. 5,363,408 entitled "Mode Selective Quadrature Amplitude Modulation Communication System" discloses a quadrature amplitude modulation (QAM) communication system in which data can be communicated in any one of a plurality of QAM modes, such as 16QAM, 32QAM, and 64QAM. A receiver detects the particular QAM mode transmitted on a trial and error basis, by attempting to decode the received data using different QAM modes until a synchronization condition is detected. The synchronization condition can require that a plurality of different synchronization tests be met. In a specific embodiment, a first synchronization test is met when a renormalization rate of a trellis decoder is below a threshold value. A second synchronization test is met when a first synchronization word is detected in the received data. A third and final synchronization test is met when a second synchronization word is detected in the received data. In order to reduce the cost of the receiver, most of the QAM mode dependent components are implemented using look-up tables stored in programmable read only memories (PROMs).

U.S. Pat. No. 5,363,408 discloses a decoder having a look-up table structure that is somewhat similar to that of the present invention. The system of U.S. Pat. No. 5,363,408 requires a custom Viterbi decoder chip and has relatively large RAM look-up tables. The system of U.S. Pat. No. 5,363,408 passes path metrics (16 bits) to the custom Viterbi decoder chip, which is not done in the present invention. The look-up table of the system of U.S. Pat. No. 5,363,408 is used to make hard decisions on the uncoded bits, which is not done in the present invention.

It would therefore be advantageous to have a trellis coded modulation decoder that makes use of a commercially available Viterbi decoder chip and requires smaller RAM look-up tables.

U.S. Pat. No. 5,363,408 discloses the use of a trellis coded modulation decoder that is limited to 16QAM, 64QAM, and 256QAM modulation schemes. U.S. Pat. No. 5,363,408 does not disclose or suggest a trellis coded modulation decoder that allows a choice of modulation schemes that may be tailored to a communication channel.

Therefore, it would be advantageous to have a flexible trellis coded modulation decoder and system having minimum hardware complexity that is not limited to 16QAM, 64QAM, and 256QAM modulation schemes, but allows a choice of modulation schemes tailored to the communication channel.

SUMMARY OF THE INVENTION

The present invention provides for a trellis coded modulation system for use with a plurality of QAM modes, including but not limited to, 16QAM, 64QAM, and 256QAM. The present invention allows a choice of modulation scheme that is tailored to the communication channel using a decoder having minimum hardware complexity.

Look-up tables in the encoder and decoder allow the use of a single encoder/decoder to map trellis coded modulation to/from multiple modulation constellations. Whereas the mode selective QAM system disclosed in U.S. Pat. No. 5,363,408 uses a similar look-up table structure, the application disclosed in this patent is different from that of the present invention.

The size of the RAM look-up tables used in the present decoder is minimized. Instead of passing path metrics (16 bits) to a custom Viterbi decoder chip, as is done with the mode selective QAM system of U.S. Pat. No. 5,363,408, recognizable sequences (6 bits) are passed to an off-the-shelf Viterbi decoder chip in the present decoder.

The look-up table of the system of U.S. Pat. No. 5,363,408 is used to make hard decisions on uncoded bits. In the present decoder, an input look-up table provides minimal information about which region the symbol was found, and an output look-up table processes the resulting information appropriately. The efficient use of look-up tables in the present decoder greatly reduces complexity and the required RAM size. Use of an off-the-shelf Viterbi decoder in the decoder reduces complexity and cost.

Thus, the present invention uses fast look-up tables for speed, simplicity, and flexibility. The decoder is capable of operating with 16QAM, 64QAM, and 256QAM modulation, along with other modulation formats such as 32CROSS modulation, for example. The concepts of the present invention may easily be used with higher order QAM constellations, CROSS constellations, and any arbitrary digital signaling constellations. Accordingly, the present invention is not limited to only QAM constellations.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4 illustrates 16QAM decision regions;

FIG. 5 illustrates expanded 16QAM decision regions (2 least significant bits only);

DETAILED DESCRIPTION

Figure 1:
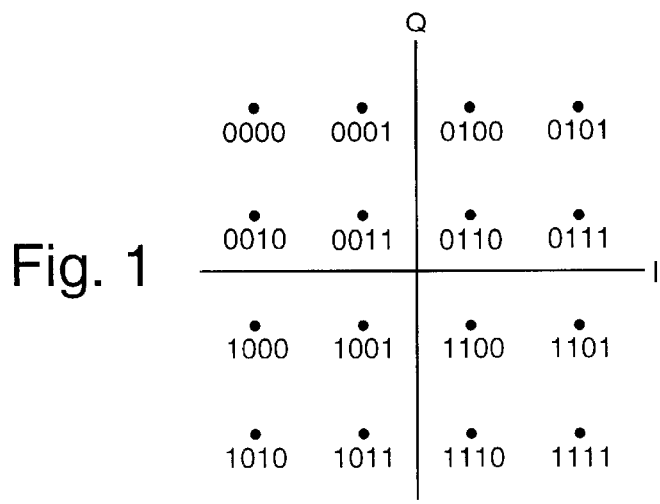
FIG. 1 illustrates a traditional 16QAM constellation with bit assignments.

Referring to the drawing figures, FIG. 1 illustrates a traditional 16QAM constellation with bit assignments. While the present invention is described with reference to the use of a 16QAM constellation, the concepts of the present invention may easily be used with higher order QAM constellations and CROSS constellations. Accordingly, the present invention is not limited to only the disclosed 16QAM constellations.

The bit assignments are important. In general, for M-ary QAM, the constellation is divided into M/4 regions, each containing four constellation points. For 16QAM, each of the four regions correspond to a quadrant. The k−2 most significant bits (MSBs), where $M=2^k$, corresponding to each symbol, are chosen to indicate the region in which they reside. The two least significant bits (LSBs) indicate a point (constellation point location) within the region.

Figure 2:
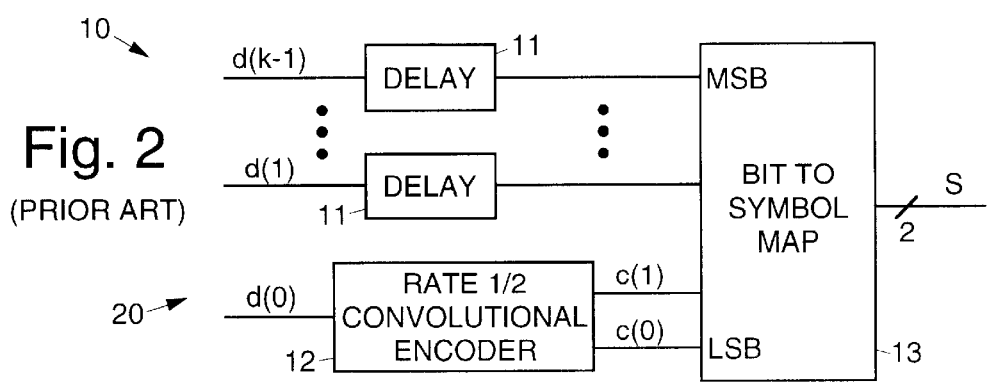
FIG. 2 illustrates the structure of a trellis coded modulation encoder used in the present invention.
Figure 3A:
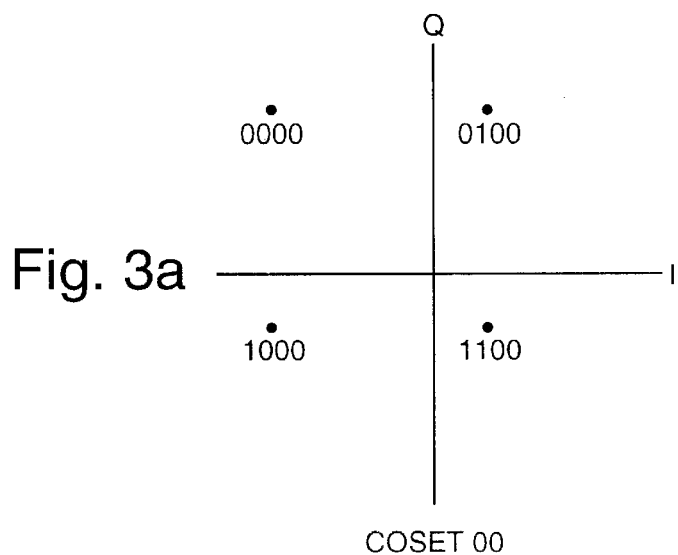
FIGS. 3a–3d illustrate cosets of a 16QAM constellation associated with each combination of code-bits.
Figure 3B:
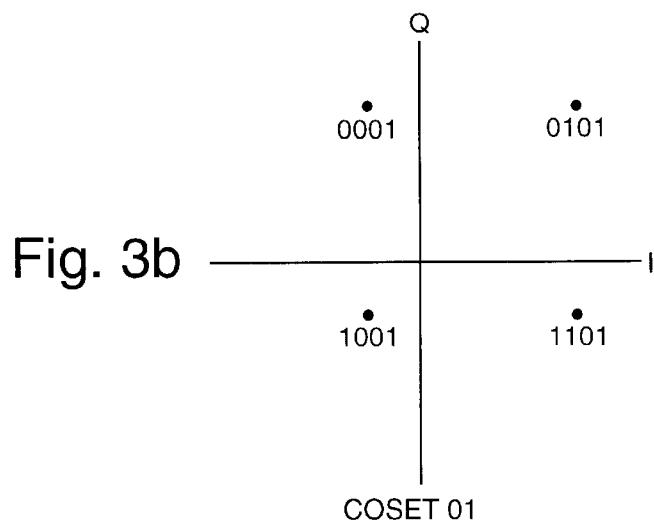
Figure 3C:
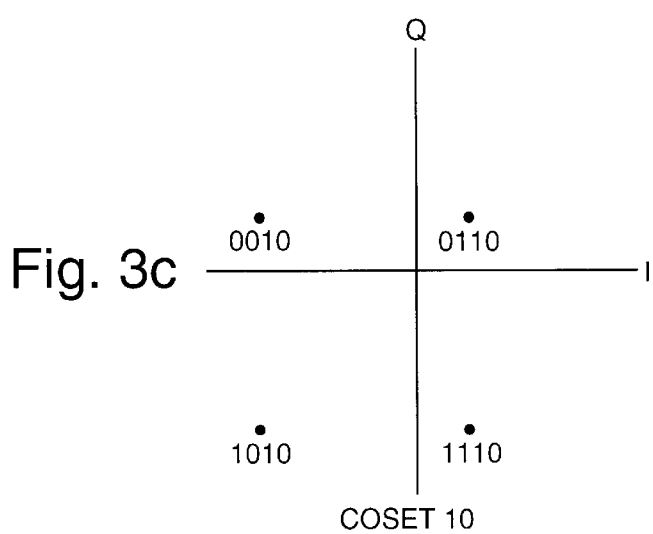
Figure 3D:
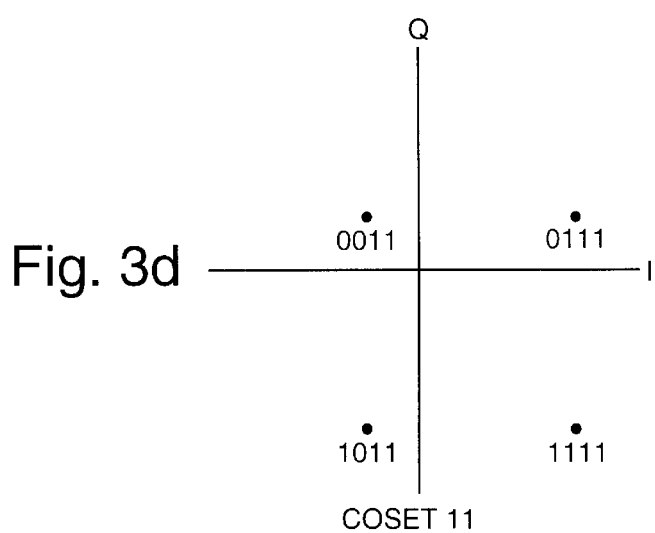

FIG. 2 illustrates the structure of a trellis coded modulation (TCM) encoder-modulator 20 or encoder 20 used in a trellis coded modulation system 10 in accordance with the principles of the present invention. The encoder 20 comprises a plurality of delay elements 11 and a rate ½ convolutional encoder 12 that receive k data bits, denoted by d(0) . . . d(k−1). Each clock period, the LSB, d(0), is encoded by the convolutional encoder 12 to generate two code bits, denoted c(0) and c(1). The outputs of the k−1 delay elements 11, d(1) . . . d(k−1), and the rate ½ convolutional encoder 12, c(0) and c(1), are input to a look-up table 13 that implements a bit-to-symbol map. The result, at the output of the bit-to-symbol map, is a complex symbol (S) representing k+1 bits, c(0), c(1), d(1) . . . d(k−1), at the output of the encoder 20.

The structure of the encoder 20 is typical of most TCM schemes, and implements a standard rate ½ convolutional encoder 12. For each k−1 data bits supplied to the encoder 20, a single k-bit symbol (S) is produced. Thus, the code rate for the architecture of the present the encoder 20 is R=k/(k−1). The two code-bits generated by the convolutional encoder 12 are assigned to the least significant bits (LSBs) of the symbol (S). Such assignments maximize the Euclidean distance between the uncoded bits, thereby minimizing the error rate associated with the uncoded bits.

To better understand this, reference is made to FIGS. 3a–3d, which illustrates cosets of the 16QAM constellation associated with each combination of code-bits. The distance between symbols in each coset is twice the minimum distance between symbols in the constellation. Thus, with a strong code on the LSBs, the net coding gain approaches 3 dB (6 dB for the doubling of minimum distance minus approximately 3 dB to account for the extra bit required over an uncoded constellation). This asymptotic coding gain holds for all QAM and CROSS constellations.

Figure 7:
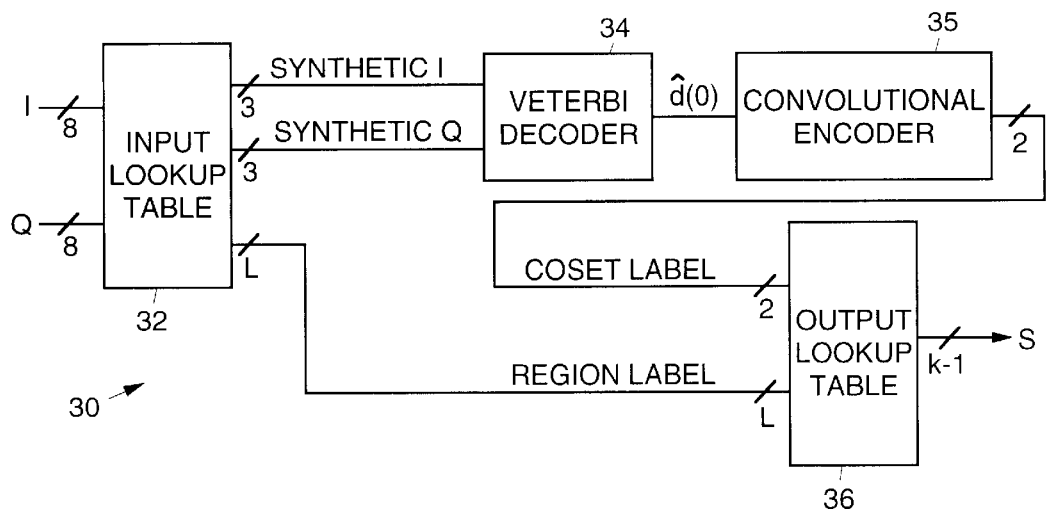
FIG. 7 illustrates a functional block diagram of an exemplary trellis coded modulation decoder in accordance with the principles of the present invention.
Figure 8:
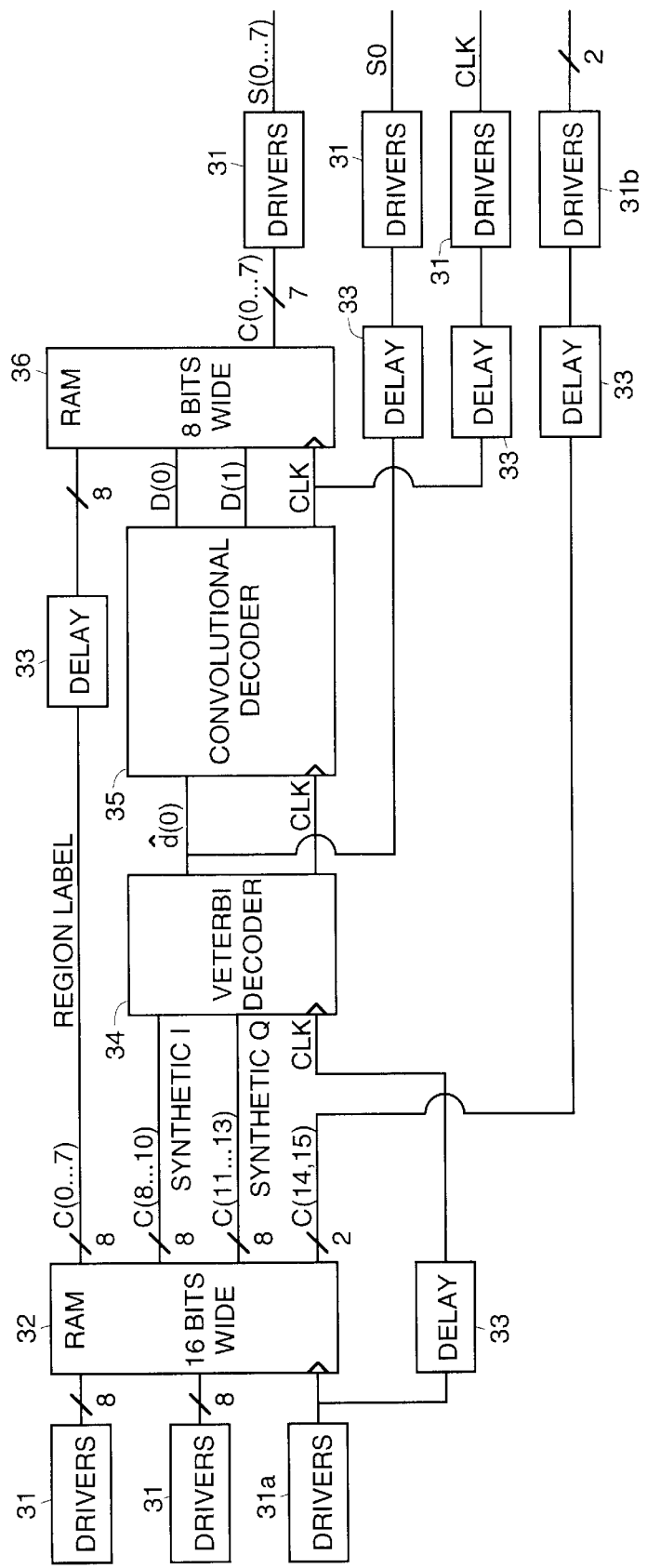
FIG. 8 illustrates details of a fully functional decoder in accordance with the principles of the present invention.

A functional block diagram of a decoder 30 used in the trellis coded modulation system 10 in accordance with the principles of the present invention is shown in FIG. 7. The block diagram of the decoder 30 shown in FIG. 7 does not include the clocks, delay elements, and the like. The complete decoder 30 is shown in FIG. 8.

To decode the data using the decoder 30, new decision regions are defined, as shown for 16QAM in FIG. 4. In general, square M-ary constellations require $(\sqrt{m}-1)^2$ decision regions. Including symbols residing on decision boundaries, each decision region contains four symbols, one from each coset.

The first task performed by the decoder 30 is to determine the decision region. This may be done using 8 bits each of I and Q information provided as an input to the decoder 30, such as is shown in FIG. 7. An input lookup table 32 is used to translate the 16 bit location of the received signal vector to an $L=[\log 2[(\sqrt{m}-1)^2]]$ bit decision region label.

Once the decision region is determined, the decoder 30 determines which of the four cosets to which the received symbol most likely belongs. The coset information, which may be represented by two bits, along with the L-bit region label, indicates the symbol most likely to have been transmitted.

The coset is chosen at the transmitter (encoder 20) by the convolutionally encoded input stream is denoted by d(0) in FIG. 2. Thus, by re-encoding a maximal likelihood estimate of the same data stream, denoted d'(0), the most likely coset may be determined. This is accomplished using a Viterbi decoder 34 to generate the maximal likelihood estimate d'(0).

In order to describe how the Viterbi decoder 34 is used, FIG. 4 will be discussed in greater detail. FIG. 4 has been redrawn in FIG. 5 by expanding the decision space such that each region and its associated symbols are separate. Only two LSBs are shown and are the only bits of interest to the Viterbi decoder 34 shown in FIG. 7.

Figure 6:
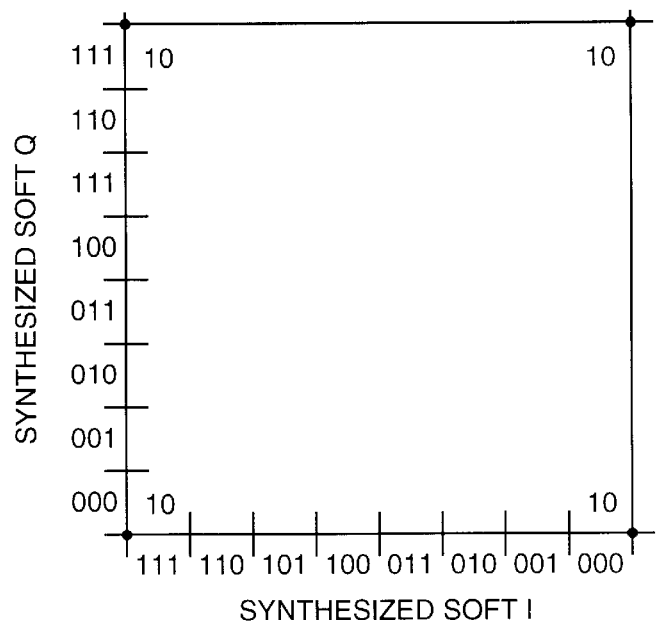
FIG. 6 illustrates synthesized soft decision data.

As is shown in FIG. 5, each region contains one symbol from each coset. The Viterbi decoder 34 is designed to operate on three bits each of I and Q soft decision data representative of the two LSBs. This information is not directly available, but is synthesized based on FIG. 5. By dividing each region into 64 sub-regions, synthetic I and Q data is generated in the input look-up table 32. By way of example, synthetic soft decision I and Q values for region 4 are shown in FIG. 6.

The Viterbi decoder 34, operating on the synthesized soft decision data, generates the maximal likelihood estimate d'(0). This maximal likelihood estimated sequence is re-encoded using a convolutional encoder 35 that is identical in functionality to the convolutional encoder 12 implemented in the TCM encoder 20, creating a maximal likelihood estimate of the coset with a 2-bit label.

With the L-bit decision region label and the 2-bit estimated coset label, the maximal likelihood symbol is chosen. This decision is implemented using an output look-up table 36 to retain as much flexibility as possible.

FIG. 8 illustrates details of a fully functional decoder 30 in accordance with the principles of the present invention. A plurality of input drivers 31 output data bits that are coupled to the input look-up table 32, which may be a implemented using a 16 bit wide random access memory (RAM), for example. A clock driver 31 a outputs a clock signal (CLK) to the input look-up table 32. Outputs of the input look-up table 32 [(C(0 . . . 7), C(8 . . . 10), (C11 . . . 13), C(14,15)] correspond to the L-bit region label C(0. . . 7), the synthetic I and Q data C(8 . . . 10), (C11 . . . 13), and extraneous bits C(14, 15). The clock driver 31 a also outputs the clock signal (CLK) to a delay element 33.

It is to be understood that only 14 signals are required for the decoder 30 to function properly. These necessary signals include bits C(0 . . . 13). Bits C(14) and C(15) are extraneous to the functionality of the decoder 30. Since RAM sizes are standard, a 16-bit output RAM is used to generate the necessary 14 bits. The additional 2 bits, C(14) and C(15), are provided for additional functionality. In one realization, these bits may be used for automatic gain control.

The first eight outputs of the input look-up table 32 (C(0 . . . 7) corresponding to the L-bit region label are input by way of a delay element 33 to the output look-up table 36. The next six outputs of the input look-up table 32 (C(8 . . . 13) corresponding to the synthetic I and Q data are input to the Viterbi decoder 34, along with a delayed clock signal derived from the clock driver 31a. The Viterbi decoder 34 outputs the maximal likelihood estimate d'(0) along with the clock signal (CLK) which are input to the convolutional encoder 35.

The convolutional encoder 35 outputs two convolutionally encoded streams, D(0), D(1) corresponding to the coset label, along with the clock signal (CLK), which are input to the output look-up table 36. The clock signal (CLK) is output from the convolutional encoder 35 by way of a delay element 33 to an output clock driver 31b. The extraneous bits, C(14, 15), are output from the input look-up table 32 by way of a delay element 33 to an output driver 31. The maximal likelihood estimate d'(0) output from the Viterbi decoder 34 is coupled by way of a delay element 33 to an output driver 31.

In one realization, the Viterbi decoder 34 is a commercial off-the-shelf integrated circuit chip, such as a model LS64705 Viterbi decoder manufactured by LSI Logic. The convolutional encoder 35 must be matched to the Viterbi decoder 34, and may be implemented as a programmable gate array to provide for flexibility.

Thus, the system 10 and decoder 30 utilizes fast look-up tables 32, 26 for speed, simplicity, and flexibility. The decoder 30 is capable of operating with 16QAM, 64QAM, and 256QAM modulation, along with other modulation formats such as 32CROSS modulation, for example.

Thus, a trellis coded modulation system comprising an improved and flexible trellis coded modulation decoder has been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A trellis coded modulation system, comprising:
   a trellis coded modulation encoder comprising a plurality of delay elements and a rate ½ convolutional encoder for processing k data bits, the rate ½ convolutional encoder processing the least significant bit to generate two code-bits indicative of a coset of symbols in the transmit symbol constellation, and a look-up table coupled to the delay elements and convolutional encoder that implements a bit-to-symbol map and that outputs a single symbol corresponding to one of the symbols in the transmit constellation; and
   a trellis coded modulation decoder for processing received symbols comprising an input lookup table for translating locations of a constellation point into a decision region label, a Viterbi decoder coupled to the input lookup table for processing synthesized soft decision data to generate a maximal likelihood estimate of the most likely coset to which a received symbol belongs, a convolutional encoder coupled to the Viterbi decoder for re-encoding the maximal likelihood estimate of the most likely coset to generate a coset label indicative of the coset to which the received symbol most likely belongs, and an output look-up table for processing the decision region label and the coset label to output a maximal likelihood symbol that corresponds to the received symbol.

2. The decoder recited in claim 1 wherein the coset is represented by two bits and the region label indicates the symbol most likely to have been transmitted.

3. The decoder recited in claim 1 wherein the input look-up table comprises a random access memory.

4. The decoder recited in claim 1 wherein the input look-up table comprises a 16 bit wide random access memory.

5. The decoder recited in claim 1 further comprising a plurality of input drivers coupled to the input look-up table that output data bits thereto and a clock driver coupled to the input look-up table that outputs a clock signal thereto.

6. A trellis coded modulation system, comprising:
   a trellis coded modulation encoder comprising a plurality of delay elements and a rate ½ convolutional encoder for processing k data bits, $d(0) \ldots d(k-1)$, the rate ½ convolutional encoder processing the least significant bit, $d(0)$, to generate two code-bits $c(0)$, $c(1)$ that are indicative of a coset of symbols in the transmit symbol constellation, and a look-up table coupled to the delay elements and convolutional encoder that implements a bit-to-symbol map that outputs a single k-bit symbol corresponding to one of the $2^k$ symbols in the transmit constellation; and
   a trellis coded modulation decoder for processing received symbols comprising an input lookup table for translating locations of a constellation point into a decision region label, a Viterbi decoder coupled to the input lookup table for processing synthesized soft decision data to generate a maximal likelihood estimate $d'(0)$ of the most likely coset to which a received symbol belongs, a convolutional encoder coupled to the Viterbi decoder for re-encoding the maximal likelihood estimate of the most likely coset to generate a coset label indicative of the coset to which the received symbol most likely belongs, and an output look-up table for processing the decision region label and the coset label to output a maximal likelihood symbol that conrresponds to the received symbol.

7. The decoder recited in claim 6 wherein the coset is represented by two bits and the region label indicates the symbol most likely to have been transmitted.

8. The decoder recited in claim 6 wherein the input look-up table comprises a random access memory.

9. The decoder recited in claim 6 wherein the input look-up table comprises a 16 bit wide random access memory.

10. The decoder recited in claim 6 further comprising a plurality of input drivers coupled to the input look-up table that output data bits thereto and a clock driver coupled to the input look-up table that outputs a clock signal thereto.

* * * * *